United States Patent [19]

Roth et al.

[11] Patent Number: 4,927,780
[45] Date of Patent: May 22, 1990

[54] ENCAPSULATION METHOD FOR LOCALIZED OXIDATION OF SILICON

[75] Inventors: Scott S. Roth; Bich-Yen Nguyen; Philip J. Tobin; Wayne Ray, all of Austin; E. Petyr Wachholz, Cedar Park; Glenn Wissen, Elgin, all of Tex.

[73] Assignee: Motorola, Inc., Schaumburg, Ill.

[21] Appl. No.: 415,685

[22] Filed: Oct. 2, 1989

[51] Int. Cl.⁵ .............................................. H01L 21/76
[52] U.S. Cl. .......................................... 437/69; 437/72
[58] Field of Search ........................ 437/69, 70, 72, 67

[56] References Cited

U.S. PATENT DOCUMENTS 4,636,281  1/1987  Buiguez et al. ...................... 437/67

FOREIGN PATENT DOCUMENTS 0071203   2/1983  European Pat. Off. ............. 437/72
0075875   4/1983  European Pat. Off. ............. 437/72
3131746   3/1982  Fed. Rep. of Germany ........ 437/69
54-10688  1/1979  Japan ................................... 437/72
56-103443 8/1981  Japan ................................... 437/69
60-4237   1/1985  Japan ................................... 437/72
61-247051 11/1986 Japan ................................... 437/72
61-276342 12/1986 Japan ................................... 437/69

Primary Examiner—Olik Chaudhuri
Attorney, Agent, or Firm—Jasper W. Dockrey

[57] ABSTRACT

An improved LOCOS isolation process is disclosed wherein an oxidizable layer is conformably dieposited to overlie a silicon nitride oxidation mask. In accordance with one embodiment of the invention, a composite layer comprising a buffer layer and an oxidation resistant material is patterned to form an oxidation mask on a silicon substrate. A layer of an oxidizable material is conformably deposited to overlie the oxidation mask. During the oxidation process used to form electrical isolation structures in the substrate, a substantial reduction in lateral oxidation encroachment is realized.

16 Claims, 3 Drawing Sheets

ENCAPSULATION METHOD FOR LOCALIZED OXIDATION OF SILICON

BACKGROUND OF THE INVENTION

This invention relates generally to semiconductor devices, and more specifically to a process for the formation of electrical isolation structures in a semiconductor integrated circuit.

The trend in semiconductor device fabrication is toward increasing density of circuit components. As the function being implemented in the integrated circuit becomes more complex, an increasing number of devices including transistors, resistors, and the like, are required, and these devices must, of course, be readily manufacturable and reliable. For a given chip size, an increase in the number of active circuit components requires that they be placed in close proximity to each other, thus forcing a corresponding reduction in the surface area of the circuit that can be occupied by electrical isolation structures. The demand to reduce the chip surface area consumed by electrical isolation structures, while maintaining the necessary electrical isolation of adjacent active components, has lead to the development of several different isolation schemes. The most common isolation fabrication technique is a process known as localized oxidation of silicon (LOCOS). This method offers high reliability and proven high volume manufacturing compatibility. A major problem with this technique, however, is the loss of active surface area caused by a lack of ability to control the process. A phenomenon known as lateral encroachment occurs, wherein the final width of isolation oxide is larger than the intended width defined by a patterned silicon nitride mask. The problem of lateral encroachment is illustrated in FIG. 1.

Shown in FIG. 1, in cross section, is a portion of a semiconductor substrate 10 which has already undergone some of the processing steps used to fabricate an isolation structure using a standard LOCOS process in accordance with the prior art. A thick isolation oxide layer 12 has been formed in exposed regions of substrate 10. The oxidation has not occurred in regions of substrate 10 covered by a previously patterned composite layer of silicon nitride 14 overlying a thin layer of pad oxide 16. The lateral encroachment, commonly known as a bird's beak, is denoted in FIG. 1 by the distance labeled X. The degree of encroachment is often related to isolation oxide thickness near the edge of the nitride oxidation mask, denoted as H in FIG. 1, and the total oxide thickness denoted as Tox. The oxidation under the nitride mask layer occurs when oxygen diffuses through the pad oxide layer 16 and reacts with the silicon underlying nitride layer 14.

The desired to suppress the lateral oxidation has lead to the development of process techniques which are intended to retard the oxygen diffusion through the pad oxide layer. One approach is to reduce the thickness of the pad oxide layer to some minimal value, thus reducing the cross sectional area available for oxygen diffusion. Prior to nitride deposition a layer of polysilicon is deposited over the thin pad oxide layer. The layer of polysilicon is used to relieve compressive stress in the substrate. This method, known as poly buffered LOCOS or PBL, achieves a slight reduction of oxide encroachment, however the process is difficult to control and requires removal of both nitride and polysilicon following the oxidation process.

Other techniques have been developed wherein the edge of the pad oxide is covered with a second layer of nitride, or an oxide layer, to protect the pad oxide from exposure to oxygen during the oxidation process, and to provide mechanical resistance to the oxidation of the silicon underlying the nitride layer. Processes known under the acronyms of SILO, SWAMI, and framed mask, are representative examples. These techniques require multiple film depositions and etch back steps making the processes complicated and difficult to perform with high reliability. Additionally, stress related failures associated with the rigorous oxidation process used to form isolation oxide layers are commonly observed. For example, deformed isolation structures are often observed as a result of ruptures of the seam between the masking nitride and the nitride or oxide cap. Attempts to improve upon these techniques and reduce stress related failures, such as rupturing of the sealing layer along the seam, have lead to the development of encapsulation techniques, for example, as described by G. Pollack in U.S. Pat. No. 4,580,330. Using this method, a cavity is formed under the edge of the nitride oxidation mask, between the nitride and the substrate, by etching back the pad oxide layer. This cavity is then filled by the a composite layer formed by a subsequent oxidation of the substrate and a second nitride deposition to prevent the oxidation of the silicon substrate near the edge of the nitride oxidation mask. This complex method requires great care in the selection of oxide and nitride layer thicknesses and involves difficult etching processing steps. Furthermore, because silicon nitride is used as an encapsulation material, this method does not solve the problem of stress relief. Accordingly, a need existed for a defect-free LOCOS process that effectively reduces the lateral oxidation encroachment in a minimum number of process steps having high reliability and manufacturing integrity.

BRIEF SUMMARY OF THE INVENTION

An object of the invention is to provide an improved LOCOS oxidation process.

Another object of the invention is to provide an improved LOCOS oxidation process with a reduced number of processing steps.

Yet another object of the invention is to provide an improved semiconductor device.

These and other objects and advantages are achieved through a process in which an oxidizable material is conformably deposited over an oxidation mask prior to formation of the isolation oxide. In one embodiment of the invention, a composite layer is formed on a silicon substrate comprising a layer of oxidation resistant material such as silicon nitride overlying a buffer layer. The composite layer is patterned to form portions over selected regions of the substrate and leaving exposed portions thereon. A conformal layer of an oxidizable material such as polysilicon is deposited to overlie the patterned composite layer and exposed portions of the substrate. A thermal oxidation is then carried out to form thick oxide isolation regions in the exposed portions of the substrate. The process is completed by the removal of oxidized polysilicon and the patterned nitride layer.

DETAILED DESCRIPTION OF THE PREFERRED EMBODIMENTS

Figure 2:
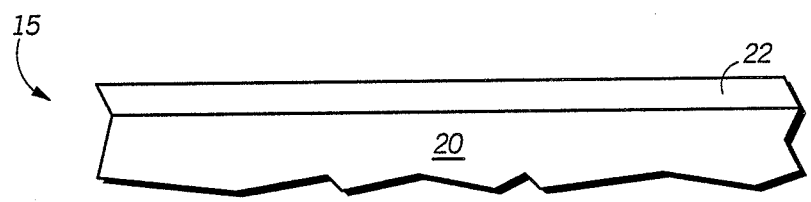
FIGS. 2 through 8 illustrate, in cross section, process steps in accordance with one embodiment of the invention.

FIGS. 2 through 8 illustrate, in cross section, process steps in accordance with one embodiment of the invention wherein electrical isolation structures are formed in an integrated circuit. Shown in FIG. 2 is a portion 15 of a silicon substrate 20 having a buffer layer 22 formed thereon. Substrate 20 is preferably thermally oxidized to form buffer layer 22 which has a thickness ranging from 10 to 100 nanometers. Alternatively, buffer layer 22 is a chemical vapor deposited silicon dioxide.

Figure 3:
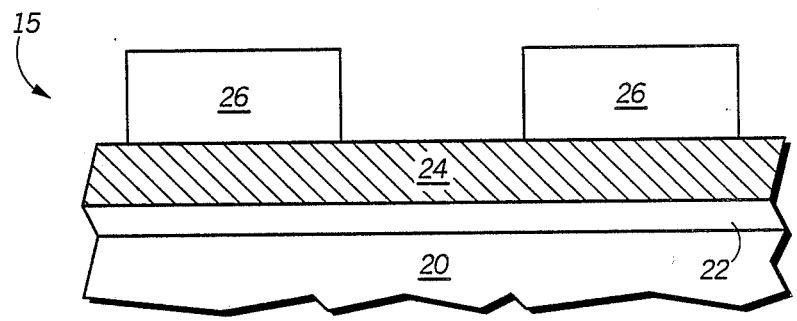

Following the formation of buffer layer 22, a layer 24 of an oxidation resistant material is deposited by chemical vapor deposition onto buffer layer 22, as shown in FIG. 3. In accordance with a preferred embodiment, oxidation resistant layer 24 is composed of silicon nitride deposited to a minimum thickness sufficient to prevent the diffusion of oxygen therethrough. The thickness of the deposited layer 24 may be in the range of thicknesses from 50 to 200 nanometers, preferably about 50 nanometers. Alternatively, layer 24 can be an oxynitride composite material deposited by chemical vapor deposition and having a thickness of about 50 nanometers. After layer 24 is formed, a photoresist layer is applied over layer 24 and patterned using conventional photolithography to form a resist mask 26. Resist mask 26 overlies regions of substrate 20 which are to be protected from the substrate oxidation used to form the isolation regions in substrate 20.

Figure 4:
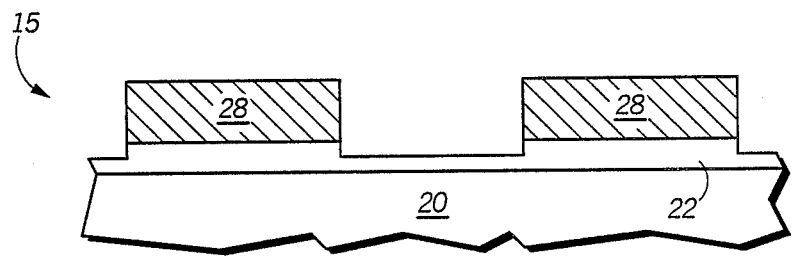

Once resist mask 26 is in place, oxidation resistant layer 24 is anisotropically etched to form an oxidation mask 28 as shown in FIG. 4. The anisotropic etch proceeds in the vertical direction faster than in the horizontal direction thus yielding an oxidation masking structure having straight sidewalls as illustrated in FIG. 4. The anisotropic etch is also nonselective in that the etch rates of layer 24 and layer 22 are approximately the same. The presently preferable etching conditions include the use of $SF_6$ and $O_2$ etch gases at a pressure of about 200 millitorr. A slight overetch is typically performed which removes a small portion of buffer layer 22 in areas not protected by resist mask 26. A conventional channel stop implant can be performed at this point in the process. Following completion of the etch and any ion implantation, resist mask 26 is removed.

Figure 5:
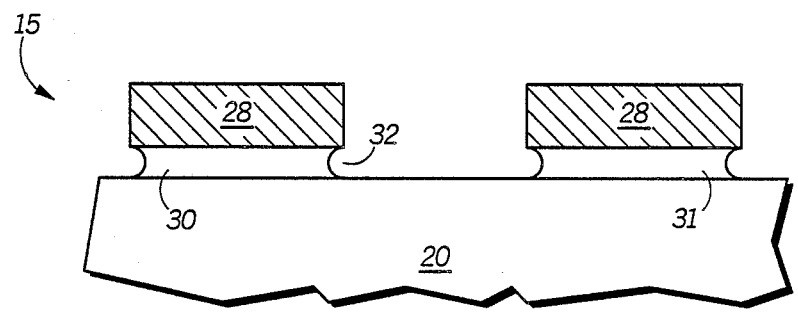

The process continues, in a preferred embodiment, as shown in FIG. 5, with the application of a wet etch to form portions 30 and 31 of buffer layer 22 using oxidation mask 28 as an etch mask. The isotropic etch used to remove unprotected portions of buffer layer 22 results in a lateral undercut of oxidation mask 28. The lateral undercut forms a cavity 32 having a lateral dimension of about 100 nm underlying the periphery of mask 28. The wet etch is a pH-buffered isotropic etch comprising a solution of 1 part hydrofluoric acid and 10 parts ammonium fluoride. Alternatively, unbuffered hydrofluoric acid can be used as an etchant in approximately the same dilution as the buffered etchant with de-ionized water.

Figure 6:
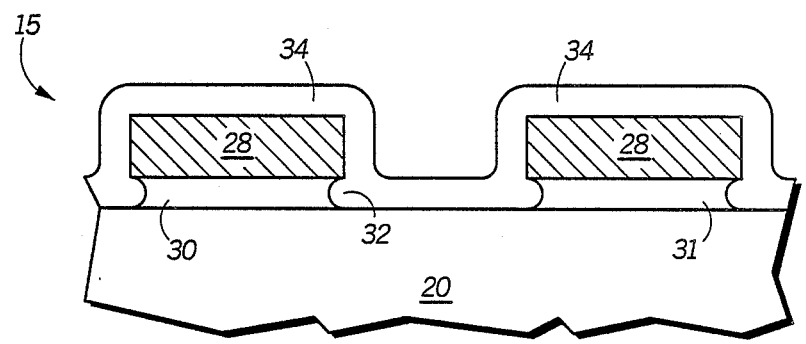

Referring to FIG. 6, the process continues with the deposition of a conformal layer 34 of an oxidizable material to overlie oxidation mask 28 substantially filling cavity 32. Conformal layer 34 is preferable chemical vapor deposited polysilicon having a thickness of about 50 nanometers. Alternatively, conformal layer 34 can be a silicon-rich form of silicon oxide obtained, for example, by low pressure chemical vapor deposition of non-stoichiometric silicon dioxide ($SiO_x$), where x is a number less than two. Additionally, conformal layer 34 can be epitaxial silicon formed by using the exposed regions of substrate 20 to initiate the epitaxial growth.

Figure 7:
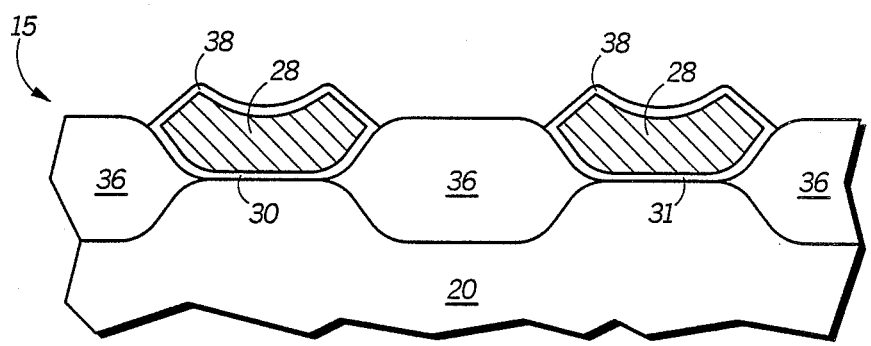

After conformal layer 34 has been formed, an oxidation is preformed to grow a thick isolation oxide 36, as shown in FIG. 7. The oxidation process is preferably carried out in an oxidation furnace at about 900 to 1200 degrees centigrade in the presence of nitrogen and steam. The oxidation process consumes conformal layer 34, forming a layer of oxidized polysilicon 38 overlying oxidation mask 28. The degree of lateral encroachment of the isolation oxide 36 under the edge of masking layer 28 is minimal as a result of the presence of conformal layer 34. The oxidizable material of conformal layer 34 reduces the lateral diffusion of oxygen through the portion 30, thus inhibiting the oxidation of substrate 20 underlying oxidation mask 28. The presence of conformal layer 34 also relieves tensile stress experienced by the substrate and mask layer 28 during the growth of the thick isolation oxide.

Figure 8:
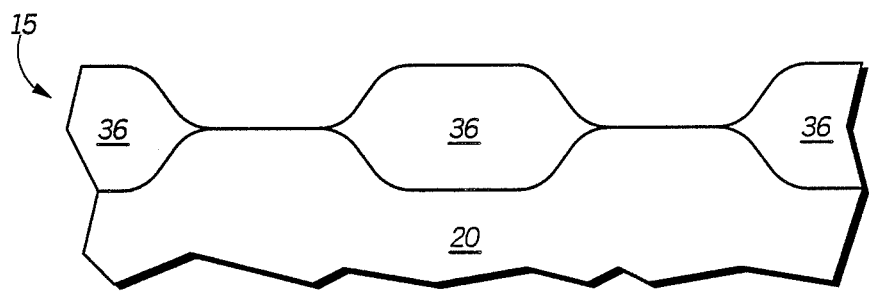

The process is completed with the removal of oxidized polysilicon layer 38 and masking layer 28 by means of a of a wet buffered hydrofluoric acid etch followed by a wet phosphoric acid etch. The isolation structures thus formed have a rounded shape with the appearance of only a slight bird's beak, as illustrated in FIG. 8. The reduction of the lateral oxide encroachment has the advantage of improved mask bias integrity by yielding a structure having a lateral dimension similar to photoresist mask 26. The close adherence of the lateral dimension of the isolation structure to that of the lithographic mask used to form resist mask 26 enables the layout and sizing of circuit components to much higher tolerance levels.

Figure 1:
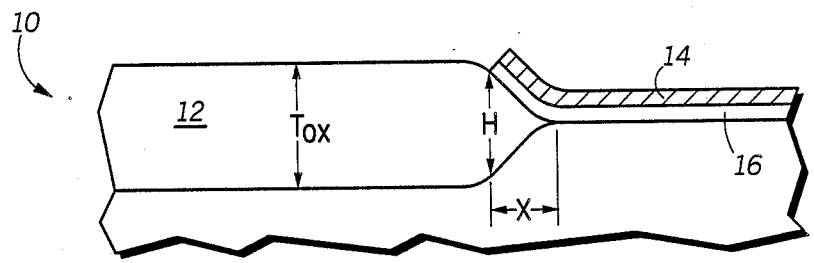
FIG. 1 illustrates, in cross section, a portion of a semiconductor device according to the prior art.

The removal of remaining portions 30 and 31 of buffer layer 22, accompanied by the formation of cavity 32, as shown in FIG. 5, is not essential to obtain the improved isolation structure of the present invention. The exposure of substrate 20 to the wet etch, used to remove remaining portions of buffer layer 22, can be varied over a range from 0 to 240 seconds. The degree in the reduction of the oxide lateral encroachment under mask layer 28 can be expressed by the ratio of the dimension X to that of dimension Tox. These dimensions have been previously described and are shown in FIG. 1. The effect of varying the etch time upon the degree of lateral encroachment is tabulated in Table I below.

TABLE I

| WET ETCH TIME (sec) | RATIO X/Tox (%) |
|---|---|
| 0 | 79 |
| 30 | 80 |
| 60 | 80 |
| 80 | 67 |
| 100 | 67 |
| 120 | 75 |
| 180 | 31 |

TABLE I-continued

| WET ETCH TIME (sec) | RATIO X/Tox (%) |
|---|---|
| 240 | 30 |

These results show a gradual progression in the amount of the reduction of lateral encroachment as the wet etch time is increased. Even in the absence of a wet etch a substantial improvement is obtained over a standard LOCOS process of the prior art. A standard LOCOS process typically produces an encroachment having a lateral dimension $X$, of about 92 percent of $T_{ox}$, the total oxide thickness.

Figure 9:
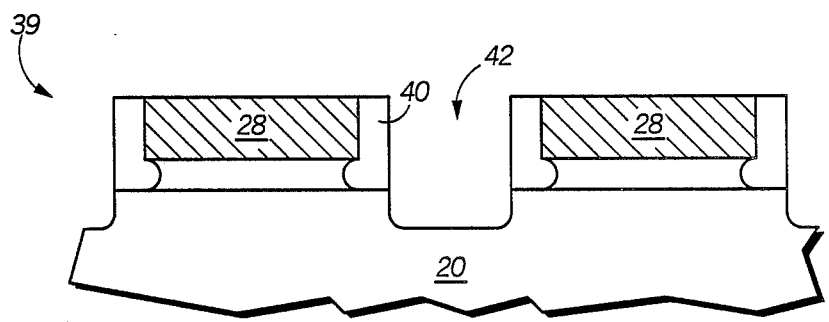
FIGS. 9 and 10 illustrate, in cross section, process steps in accordance with an alternative embodiment of the invention.
Figure 10:
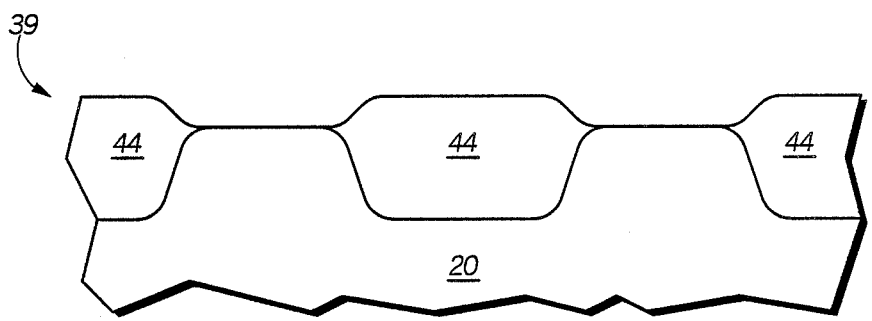

An alternative embodiment of the present invention is illustrated, in cross section, in FIGS. 9 and 10 as portion 39 of semiconductor substrate 20. For clarity, elements the same as those previously described have retained the same number.

In the alternative embodiment, instead of oxidation of substrate 20 after the formation of the structure of FIG. 6, an anisotropic etch of conformal layer 34 is performed to form a sidewall extension 40 bounding oxidation mask 28 as shown in FIG. 9. The anisotropic etch used to form extension 40 removes essentially all of layer 34 directly overlying oxidation mask 28 forming a continuous planar surface. At this point the structure can be oxidized to form isolation oxide 36, followed by the removal of oxidation mask 28 to form the structure shown in FIG. 8. Alternatively, the exposed portion of substrate 20 is also etched to form a depression 42 in the surface of substrate 20. After depression 42 is formed, a wet etch using hydrofluoric acid diluted to 1 part in 750 parts nitric acid is performed to remove a thin surface layer of silicon from depression 42.

In accordance with the alternative embodiment of the invention, the previously described oxidation process is carried out to form a recessed isolation structure 44, as illustrated in FIG. 10. The oxidized polysilicon layer 38, and oxidation mask 28, have been removed, in FIG. 10, by the wet etch processes described above. The recessed isolation oxide 44 has the advantage of producing a more planar surface for the subsequent formation of other device components overlying the isolation structures.

An advantage of the present invention includes a departure of the traditional purpose of the oxidation resistant layer in the LOCOS process. The thickness of layer 24 is only that thickness necessary to prevent the diffusion of oxygen therethrough. This stands in contrast with the prior art where some minimal thickness is necessary to provide the mechanical function of countering the tensile stress experienced by the substrate and the overlying nitride layer during the oxidation of exposed substrate regions. The use of an oxidizable material, such as polysilicon, absorbs the oxidation induced stress occurring in the substrate, thus preserving the integrity of the interface between the oxidation mask 28 and substrate 20.

Thus it is apparent that there has been provided, in accordance with the invention, an improved method for forming an electrical isolation structure which fully meet the objects and advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention.

For example, composite structures such as a polysilicon layer overlying a layer of oxide can be formed prior to the deposition of the oxidation resistant layer in a manner similar to the PBL process. Additionally, the etching of the conformal layer of oxidizable material can be continued until only a small portion remains in the recess under the edge of the oxidation mask. It is therefore intended to include within the invention all such variations and modifications as fall within the scope of the appended claims.

We claim:

1. A method for forming an integrated circuit device on a semiconductor substrate comprising the steps of:

forming a buffer layer to overlie said substrate;

depositing a layer of oxidation resistant material onto said buffer layer to form a composite layer comprising said buffer layer and said layer of oxidation resistant material over said buffer layer;

etching selected portions of said composite layer to expose portions of said substrate and to leave masking portions of said composite layer overlying said substrate;

etching said buffer layer to form a recess under an edge portion of said oxidation resistant layer of said masking portions;

depositing a conformal layer of oxidizable material to overlie said masking portions of said composite layer substantially filling said recess with said conformal layer; and oxidizing said conformal layer and said exposed portions of said substrate to form electrical isolation regions in said exposed portions of said substrate.

2. The method of claim 1 further comprising the step of anisotropically etching said conformal layer to form a portion of said conformal layer bounding said masking portions and substantially planar with the top surface of said masking portions.

3. The method of claim 2 further comprising the steps of:

etching said exposed portions of said substrate to form depressions therein; and removing said masking portions subsequent to oxidizing of said conformal layer.

4. The method of claim 1 further comprising the step of removing said oxidized layer and said masking portions.

5. The method of claim 1 wherein said oxidization resistant material is selected from the group consisting of silicon nitride and oxynitride.

6. The method of claim 1 wherein said substrate comprises silicon and said step of forming a buffer layer comprises oxidation of silicon.

7. The method of claim 1 wherein said step of forming a buffer layer comprises chemical vapor depositing a layer of silicon dioxide.

8. The method of claim 1 wherein said oxidizable material is selected from the group consisting of polysilicon and silicon-rich dioxide.

9. The method of claim 1 wherein said step of depositing an oxidizable material comprises depositing epitaxial silicon.

10. The method of claim 8 wherein said step of oxidizing completely consumes said conformal layer converting said conformal layer to silicon dioxide.

11. A method for forming a semiconductor device comprising the steps of:

providing a silicon substrate having active surface regions;

forming a pad oxide layer to overlie said substrate;

depositing a layer of nitride to overlie said pad oxide;

forming a photoresist mask over active regions of said substrate;

etching said nitride and said pad oxide layer to form portions thereof overlying said active surface regions of said silicon substrate and leaving exposed portions of said substrate;

removing said photoresist mask;

etching said portions of said pad oxide layer to form a recess under an edge portion of said portion of said nitride layer;

depositing a layer of polysilicon to overlie said portions of said nitride layer and substantially filling said recess with said layer of polysilicon; and oxidizing said polysilicon layer and said exposed portions of said substrate to form electrical isolation regions in said exposed portions of said substrate.

12. The method of claim 11 further comprising the step of anisotropically etching said polysilicon layer to form a portion of said polysilicon layer bounding said portion of said nitride layer and said portion of said pad oxide layer and substantially planar with the top surface of said portion of said nitride layer.

13. The method of claim 11 further comprising the step of removing said portion of said nitride layer and said portion of said pad oxide layer subsequent to oxidizing said polysilicon layer and said exposed portions of said substrate.

14. The method of claim 11 wherein said step of oxidizing completely consumes said polysilicon layer converting said polysilicon layer to silicon dioxide.

15. A method for forming electrical isolation structures in a silicon substrate wherein said isolation structures are substantially planar with the surface of said substrate comprising the steps of:

providing a silicon substrate having active surface regions;

forming a pad oxide layer to overlie said substrate;

depositing a layer of nitride to overlie said pad oxide;

forming a photoresist mask over active regions of said substrate;

etching said nitride and said pad oxide layer to form portions thereof overlying said active surface regions of said silicon substrate and leaving exposed portions of said substrate;

etching said portions of said pad oxide layer to form a recess under an edge portion of said portion of said nitride layer;

removing said photoresist mask;

depositing a layer of polysilicon to overlie said portions of said nitride layer substantially filling said recess with said deposited layer of polysilicon;

anisotropically etching said polysilicon layer to form a portion of said polysilicon layer bounding said portion of said nitride layer and said portion of said pad oxide layer and substantially planar with the top surface of said portion of said nitride layer;

etching said exposed portions of said substrate to form depressions therein;

etching said depressions to remove a surface layer of silicon from said depressions;

oxidizing said polysilicon layer and said depressions of said substrate to form electrical isolation regions in said depressions of said substrate; and removing said portions of said nitride layer and said portions of said pad oxide layer.

16. The method of claim 15 wherein said step of oxidizing completely consumes said polysilicon layer converting said polysilicon layer to silicon dioxide.

* * * * *